United States Patent

Kuramoto et al.

[11] Patent Number: 5,928,440
[45] Date of Patent: Jul. 27, 1999

[54] METHOD OF FORMING SOLDER FILM

[75] Inventors: Takeo Kuramoto; Masataka Watabe; Satoshi Noda, all of Tokyo; Takashi Shoji; Takekazu Sakai, both of Saitama, all of Japan

[73] Assignee: Showa Denko K.K., Tokyo, Japan

[21] Appl. No.: 08/513,397

[22] Filed: Aug. 10, 1995

Related U.S. Application Data

[60] Division of application No. 08/332,488, Oct. 31, 1994, Pat. No. 5,556,023, which is a continuation-in-part of application No. 08/144,322, Nov. 1, 1993, abandoned.

[30] Foreign Application Priority Data

Oct. 30, 1992 [JP] Japan ..................................... 4-315738
Jan. 11, 1993 [JP] Japan ..................................... 5-19366

[51] Int. Cl.[6] ........................................................ B23K 35/24
[52] U.S. Cl. .................................. 148/24; 148/23; 148/22
[58] Field of Search .................................. 148/24, 23, 22

[56] References Cited

U.S. PATENT DOCUMENTS

| 3,716,421 | 2/1973 | Burkhart et al. | 148/6.14 R |
|---|---|---|---|
| 3,736,653 | 6/1973 | Maierson et al. | 29/496 |
| 4,172,547 | 10/1979 | Del Grande et al. | 228/121 |
| 4,298,407 | 11/1981 | Taylor | 148/24 |
| 4,380,518 | 4/1983 | Wydro, Sr. | 264/13 |
| 5,110,384 | 5/1992 | Dudek et al. | 156/89 |
| 5,114,744 | 5/1992 | Cloutier et al. | 427/96 |

FOREIGN PATENT DOCUMENTS

| 0 285 266 | 10/1988 | European Pat. Off. . | |
|---|---|---|---|
| 0 428 383 | 5/1991 | European Pat. Off. . | |
| 58-68467 | 4/1983 | Japan . | |
| 3-50853 | 3/1991 | Japan | H01L 23/50 |
| 3221295 | 9/1991 | Japan . | |
| 4-10694 | 1/1992 | Japan | H05K 3/24 |

OTHER PUBLICATIONS

Patent Abstracts of Japan, vol. 017, No. 081 (E–1321) Feb. 18, 1993.
Patent Abstracts of Japan, vol. 015, No. 191 (E–1068) May 16, 1991.
Patent Abstracts of Japan, vol. 548, No. 548 (E–856) Dec. 7, 1989.
Patent Abstracts of Japan, vol. 158, No. 158 (E–1191) Apr. 17, 1992.
Patent Abstracts of Japan, vol. 026, No. 026 (M–1202) Jan. 22, 1992.
Data Base WPI. Week 9145, Derwent Publications Ltd., AN 91–329848.
Data Base WPI. Week 9145, Derwent Publications Ltd., An 82–36159.

*Primary Examiner*—Patrick Ryan
*Assistant Examiner*—M. Alexandra Elve
*Attorney, Agent, or Firm*—Sughrue, Mion, Zinn, Macpeak & Seas, PLLC

[57] ABSTRACT

A method of forming a solder film on a metallic surface such as a pad of a metallic circuit of a printed circuit board and a lead frame of electronic parts, which is capable of forming a precise and fine pattern and which comprises selectively imparting tackiness to only a predetermined part of the metallic surface by means of a tacky layer-forming solution, adhering a powdered solder to the resulting tacky part, and then melting the solder by heating to thereby form a solder film.

2 Claims, 1 Drawing Sheet

METHOD OF FORMING SOLDER FILM

This is a divisional of application Ser. No. 08/332,488, filed Oct. 31, 1994, now U.S. Pat. No. 5,556,023, which is a file wrapper continuation-in-part of prior application Ser. No. 08/144,322 filed Nov. 1, 1993 (abandoned).

FIELD OF THE INVENTION

The present invention relates to a method of forming a solder film. More particularly, this invention relates to a method suitable for forming on a printed circuit board a solder circuit which is a solder layer formed beforehand on a pad of a metallic circuit of the printed circuit board for easy mounting of electronic parts thereon, or for forming of a solder layer on an electronic part.

BACKGROUND OF THE INVENTION

In recent years, printed circuit boards (also referred to as printed boards) were developed which comprise an insulating substrate, such as a plastic substrate (including film), a ceramic substrate, or a metal substrate coated with a plastic or other substance, and an electronic circuit formed thereon; and a technique of soldering an electronic part such as an IC element, semiconductor chip, resistor, or capacitor to the circuit surface of such a printed board to constitute an electronic device is being widely employed.

In producing the above-described circuit device having electronic parts mounted thereon, the ordinary method for soldering a lead terminal of the electronic part to a predetermined pad of the circuit comprises forming a thin solder layer beforehand on either or both of the pad and the lead terminal, positioning the electronic part, and then melting (reflowing) the thin solder layer(s) to solder the electronic part on the circuit.

For the formation of the solder circuit (thin solder layer), such methods as plating, dipping (immersion) in a solder bath, and printing of a solder powder paste have been employed. However, as the trend toward the increase in mounting density, solder circuits have been required to have even finer patterns and there also are desires for improvements in working efficiency and on-specification rate and for circuit pattern miniaturization. It is, therefore, becoming difficult to cope with these requirements with the above methods.

Among those conventional methods, the plating method is applicable for formation of solder circuits having highly precise and fine patterns.

The plating method is classified into electroplating and electroless plating. Use of electroplating, however, encounters difficulties in attaining electrical conductivity because, in actual printed circuit boards, the parts in which solder circuits are to be formed are present independently from the circuit parts in most cases. On the other hand, electroless plating has a technical problem that it is difficult to obtain a thick solder layer having a thickness necessary in practical use, although the problem concerning electrical conductivity in the electroplating is overcome.

A method of electrostatically applying flux-coated solder powder particles on a circuit part has been proposed in JP-A-3-50853. (The term "JP-A" as used herein means an "unexamined published Japanese patent application".) However, this method is still unable to easily produce a high-accuracy fine pattern.

Another method for the solder circuit formation has been proposed in JP-A-4-10694, which comprises applying a flux on a circuit part by printing, adhering a powdered solder to the flux-printed part, melting the solder by heating it to a temperature not lower than the melting point of the solder, and then blowing a gas on the solder melt to level it to thereby form a solder circuit. This method is disadvantageous in that a high degree of skill is required because high-precision printing of a flux on a pad is difficult and in addition there is a fear of bridging between patterns spaced at a minute gap during the leveling of the solder melt.

Also in the case where a solder coat (solder layer) is formed on a lead terminal of an electronic part, there are the same technical problems as those in the formation of solder circuits.

As a result of extensive studies made in order to improve the precision of solder patterns which are required to be fine, it has been found that the plating method, which has attained the highest precision, still has several problems and has to be improved in working efficiency and other respects.

SUMMARY OF THE INVENTION

An object of the present invention is to provide a method of efficiently forming a precise, fine, bridge-free solder film pattern on a metallic circuit or on an exposed metal of an electronic part by a simple procedure without the necessity of troublesome operations such as positioning.

It has been found that a certain chelate compound acts on an exposed metallic surface to render it tacky, which makes it possible to precisely adhere a powdered solder only to the resulting tacky surface. The present invention is a method for forming a solder film, which comprises selectively imparting tackiness to only an exposed metallic part of a printed circuit board or electronic part by means of a tacky layer-forming solution, adhering a powdered solder to the resulting tacky part, and then melting the solder by heating to form a solder film on the part.

A preferred embodiment of the present invention is the method for forming a solder film, wherein the adhered solder powder is heated to fix in situ, followed by applying a flux to the fixed solder, before melting the solder.

Another preferred embodiment of the present invention is the method for forming a solder film, wherein the tacky layer-forming solution contains at least one compound (tackiness-imparting compound) selected from benzotriazole derivatives, naphthotriazole derivatives, imidazole derivatives, benzoimidazole derivatives, mercaptobenzothiazole derivatives, benzothiazole thiofatty acid derivatives, and triazine derivatives.

DETAILED DESCRIPTION OF THE INVENTION

Figure 1:
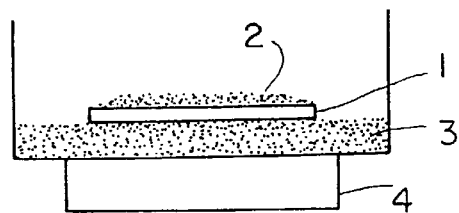
FIG. 1 is a diagrammatic view illustrating a solder-adhering technique in which a printed circuit board is placed on a solder powder layer and a solder powder is allowed to adhere to the printed board while a solder powder is being fed.

Examples of printed circuit boards to which the present invention can be applied include a single-sided printed circuit board, a double-sided printed circuit board, a multi-layered printed circuit board, or a flexible printed circuit board; each comprising a substrate obtained by laminating a metal plate to, e.g., a plastic base, plastic film base, glass cloth base, paper-based epoxy resin base or ceramic base, or an insulated substrate obtained by covering a metal base with, e.g., a plastic or ceramic, and a circuit formed thereon. Further, the printed circuit board may be one comprising a substrate in continuous sheet form and plurality of circuits independently formed thereon. Examples thereof include a circuit board obtained by laminating a foil of highly conductive metal such as copper to a thermoplastic resin film, e.g., a polyimide or polyester film, with an adhesive and further laminating a photosensitive resin film as a resist, followed by light exposure, development and etching to form plurality of circuits, and a circuit board obtained by directly printing plurality of circuits on a thermoplastic film.

Metal for use in circuit formation is copper in most cases. Although copper is the most suitable metallic material for a tackiness-imparting compound contained in a tacky layer-forming solution to be used in this invention, e.g., benzotriazole derivatives, naphthotriazole derivatives; imidazole derivatives, benzoimidazole derivatives, mercaptobenzothiazole derivatives, benzothiazole thiofatty acid derivatives, triazine derivatives, etc., the circuit-forming metal is not limited to copper and may be other metals, such as gold, silver, tin, nickel, tungsten, lead, copper alloys (e.g., Cu-P) and solder. The metals other than copper tend to show poor bondability with the tackiness-imparting compound, as compared to copper.

The method of the present invention is also applicable to ordinary electronic parts required to be solder-coated. Examples of such electronic parts include various kinds of packages such as a DIP (dual inline package), an SIP (single inline package), a PGA (pin grid array), an SOP (small online package), a QFP (quad flat package), a semiconductor chip, and a tape carrier package.

Metal constituting a lead frame of such an electronic part is, in most cases, Alloy 42 (40% nickel and 60% iron) or tin-containing copper. Although these metallic materials, like copper, are suitable for the tackiness-imparting compound to be used in this invention, the metal constituting the lead frame is not limited to these materials and may be others, such as copper and copper alloys (e.g., Ni—Cu). Further, the part to be coated with a solder may be all of the metallic part or may be a part thereof.

Preferred examples of the tackiness-imparting compound to be used in the present invention, which chemically reacts with a metal to develop tackiness, include benzotriazole derivatives represented by formula (1), naphthotriazole derivatives represented by formula (2), imidazole derivatives represented by formula (3), benzoimidazole derivatives represented by formula (4), mercaptobenzothiazole derivatives represented by formula (5), benzothiazole thiofatty acid derivatives represented by formula (6), and triazine derivatives represented by formula (7):

(1)

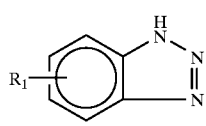

(wherein $R_1$ represents hydrogen atom or an alkyl group)

(2)

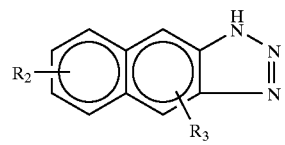

(wherein $R_2$ and $R_3$ each represents hydrogen atom or an alkyl group)

(3)

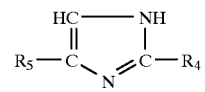

(wherein $R_4$ represents an alkyl group and $R_5$ represents hydrogen atom or an alkyl group)

(4)

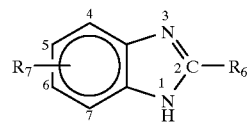

(wherein $R_6$ represents an alkyl group or an alkylthio group and $R_7$ represents hydrogen atom or an alkyl substituent at the 4- or 5-position)

(5)

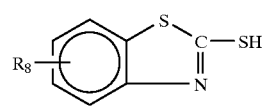

(wherein $R_8$ represents hydrogen atom or an alkyl group)

(6)

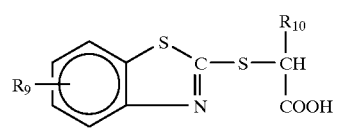

(wherein $R_9$ and $R_{10}$ each represents hydrogen atom or an alkyl group)

(7)

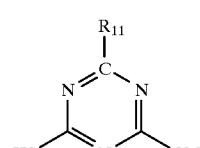

(wherein $R_{11}$ is either

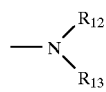

or $NHR_{14}$, where $R_{12}$, $R_{13}$, and $R_{14}$ each represents an alkyl group or and alkylene group, and M represents an alkali metal (e,g., Na, K, Li) or hydrogen atom).

In the benzotriazole derivatives represented by formula (1), $R_1$ may be a hydrogen atom but higher tackiness is generally obtained when $R_1$ is an alkyl group having 8 or more carbon atoms.

In the imidazole derivatives and benzoimidazole derivatives represented by formulae (3) and (4), respectively, $R_4$, $R_5$, $R_6$, and $R_7$ each is preferably an alkyl or alkylthio group having 8 or more carbon atoms because such groups generally bring about higher tackiness.

In the benzothiazole thiofatty acid derivatives represented by formula (6), $R_{10}$ preferably has 1 or 2 carbon atoms.

Further, in the triazine derivatives represented by formula (7), $R_{12}$, $R_{13}$, and $R_{14}$ each preferably has 8 or more carbon atoms.

At least one of the tackiness-imparting compounds capable of reacting with a metal to develop tackiness is dissolved in water. It is preferred that this solution (hereafter referred to as "a tacky layer-forming solution") be used after being rendered acidic (i.e., pH<7), more preferably slightly acidic with a pH of about 3 to 4. In the case where the exposed metal to be treated is copper, an inorganic acid such as hydrochloric acid, sulfuric acid, nitric acid, or phosphoric acid may be used for the purpose. Organic acids such as formic acid, acetic acid, propionic acid, malic acid, oxalic acid, malonic acid, succinic acid, and tartaric acid may also be used.

Although the concentration of the tackiness-imparting compound in the solution is not strictly limited, it is suitably regulated according to the solubility of the compound and use conditions. The preferred range of the concentration is from 0.05 to 20% by weight since such solutions are easy to use. When the concentration is less than 0.05% by weight, formation of a thin tacky film tends to be insufficient.

The treatment for imparting tackiness is conducted either by applying the solution on the exposed metallic part on which a solder film is to be formed or by immersing that metallic part in the solution. In the treatment, a temperature slightly higher than room temperature enables formation of a tacky layer at a moderate rate in a large amount. Although the temperature for the treatment is not particularly limited because it varies depending on the concentration of the tackiness-imparting compound, the kind of the metal, etc., the preferred range thereof is generally from 30 to 60° C. The immersion time is not particularly limited, but it is preferable from the standpoint of working efficiency that other conditions be controlled so as to regulate the immersion time within the range of from 5 seconds to 5 minutes. In this case, it is preferred to use a tacky layer-forming solution containing copper ions in an amount of 10 to 2,000 ppm (by weight), desirably so to 500 ppm, because use of this solution improves the efficiency of tacky layer formation, i.e., the rate of the layer formation, the amount of the layer, etc.

Before the printed circuit board is subjected to treatment with the tacky layer-forming solution, only the metallic circuit part on which a solder circuit is to be formed is kept in an exposed state, with the other metallic circuit part being covered with a resist or other material. In the case where the whole of an electronic part is immersed in the tacky layer-forming solution, the metallic part other than the part on which a solder film is formed is covered with a molding resin so as to avoid contact with the solution.

Upon the immersion in, or coating or printing with the solution containing the tackiness-imparting compound described above, the compound adheres to the exposed metallic surface by a chemical reaction to render the surface tacky. After water-washing and drying, a printed circuit board or metallic part in which the exposed metallic surface is tacky is obtained. A solder powder is sprinkled over the tacky surface to allow the solder powder to adhere thereto and the excess solder powder is removed. Thereafter, the adherent solder powder is melted and leveled by heating to thereby form a solder film. Before melting the solder powder, the adherent solder powder may be heated to fix in situ, followed by applying a flux to the fixed solder. The thickness of the solder film is preferably from 1 to 200 μm while it varies depending upon use conditions of the solder film.

If the solder film thus formed has a thickness below a required level, the thickness of the solder film (especially on a metal other than copper) can be increased to the desired level by conducting the treatment with the tacky layer-forming solution two or more times, since the tacky layer-forming solution imparts tackiness also to solder surfaces though this tackiness is weaker than that imparted to copper.

For adhering a powdered solder to the tacky surface, various methods may be used. Examples thereof include a mask method in which a solder powder is allowed to adhere through a mask having an opening; a spray method in which a solder powder is sprayed over the whole of an exposed metallic surface having the tacky surface and the unnecessary solder powder is then removed; a fluidized bed method in which the printed board having the tacky surface is passed through a tank in which a solder powder is suspended; and a roller method in which a solder powder layer formed on a tacky roller or mesh roller is brought into contact with the printed board.

One example of simple methods for adhesion comprises holding the printed circuit board having a tacky surface on the exposed metallic surface on a slant, and dropping a solder powder from above little by little. The appropriate range of the slant angle of the exposed metallic surface is from 10 to 85 degrees, preferably from 20 to 75 degrees, with the normal line. The slant angle below 10 degrees is undesirable because the surface partly remains exposed with no solder powder adherent thereto, while the slant angle above 85 degrees is undesirable in that a solder powder is unlikely to fall off.

It is preferable that the exposed metallic surface having a tacky surface be vibrated in order to densely adhere the solder powder. This technique is particularly effective in forming a solder film on a through-hole part or on the exposed metallic circuits of a double-sided printed circuit board. In one embodiment of this technique, the exposed metallic surface having a tacky surface is buried in a solder powder and the printed board is transferred in a vibratory conveyor.

Figure 2:
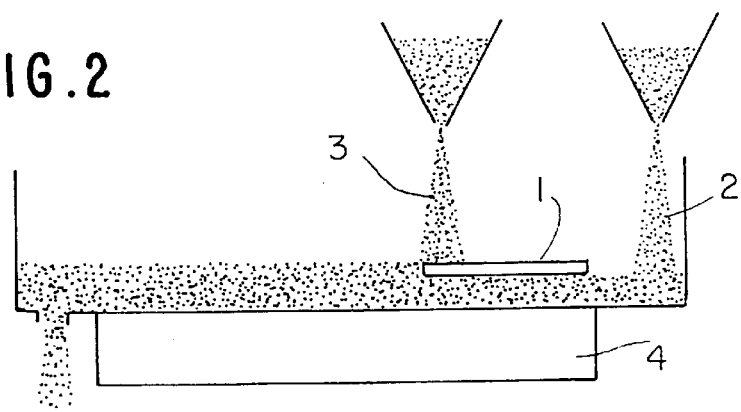
FIG. 2 is a diagrammatic view illustrating a solder-adhering technique in which a solder powder is allowed to adhere while a solder powder layer is being moved.

The amplitude of the vibration for the adhesion of solder powder may be from 0.1 to 20 mm. However, in the case of transferring the printed circuit board by means of vibration as shown in FIG. 2, the amplitude is preferably from 1 to 10 mm. The frequency may be from 100 to 3,000 cpm (cycle per minute), and preferably from 500 to 1,500 cpm. The effective range of the vibrational angle (from the horizontal)

is from 0 to 90 degrees. In the case of transferring the printed board by means of vibration as shown in FIG. 2, the preferred range thereof is from 30 to 60 degrees.

In the case where the printed circuit board has a tackiness-imparted metallic circuit on one side thereof, a solder powder is fed to the printed board with the circuit side facing upward, and the printed board is vibrated to densely adhere the solder powder to the tacky part without forming a void or other defects. If it is desired to continuously conduct the above method, this may be accomplished as follows. The printed circuit board is placed on a vibratory floor and the floor is moved, or the printed board is placed on a slant floor and the floor is vibrated. A solder powder is continuously fed to the tackiness-imparted part of the printed board which is kept moving along with the solder powder, thereby densely adhering the solder powder by means of vibration.

In the case where the printed circuit board has a tackiness-imparted metallic circuit in a through-hole part thereof or on both sides thereof, the printed circuit board is placed on a solder powder layer and the circuit board is vibrated while a solder powder is being fed to the upper side thereof. If it is desired to continuously conduct the above method, this may be accomplished by placing the printed circuit board on a solder powder layer formed on a slant floor and a vibration is applied in a slant direction to vibrate the solder layer.

By thus bringing the printed circuit board into contact with a solder powder layer with vibration, the solder powder can be most densely adhered to the tacky surface.

Methods for practicing the above are explained below with reference to the Figures.

In FIGS. 1 and 2, numeral 1 denotes a printed circuit board which has a through-hole part or to which tackiness has been imparted at exposed metallic circuit parts on both sides thereof. This printed board is placed on a solder powder layer 3 on a vibrator 4, and is vibrated while a solder powder 2 is being fed thereto from above, thereby densely adhering the solder powder. The vibration may be in any of the vertical direction, a horizontal direction (reciprocating or circular motion), and a slanting vertical direction. When the solder layer is to be moved in one direction, the whole can be moved smoothly by keeping the floor oblique and applying a vibration in a slanting vertical direction.

Figure 3:
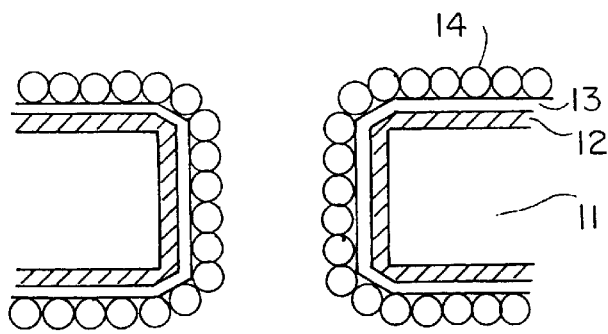
FIG. 3 is an enlarged view of a through-hole part to which a solder powder is adhered.

By conducting the treatment described above, solder particles 14 can be densely adhered to a tacky layer 13 formed by the tackiness-imparting compound on the surface of the through-hole part through which copper circuits 12 on both sides of an insulating substrate 11 are connected, as shown in FIG. 3.

The material of the solder powder can be arbitrarily selected, according to use, from eutectic, silver-containing, and bismuth-containing solders and other solders. The solder powder preferably has a diameter of from 1 to 500 μm.

It is preferred to cover the surface of the solder powder with a resin composition containing a rosin or a rosin derivative as an essential component and further containing at least one of a carboxylic acid, an amine, an amine salt, and a wax, because the thus-coated solder powder shows improved reflow properties and in turn, improves the reliability of electrical connection.

Examples of the rosin derivative that can be used as an essential component of the resin composition include hydrogenated rosins, disproportionated rosins, polymerized rosins, rosins modified with maleic acid, aldehyde-modified rosins, rosin esters, and rosin-modified phenolic resins. The rosin or rosin derivative is an essential ingredient for enabling the solder particle surfaces to impart a film-forming ability. If the rosin amount is too small, these effects are reduced. If a rosin is used alone, reflow of the solder powder does not proceed smoothly.

For the purpose of improving reflow properties, at least one of a carboxylic acid, an amine, an amine salt, and a wax is added to the rosin according to one preferred embodiment of the present invention.

The carboxylic acid, which has a carboxyl group, is not limited in carbon number, etc., and examples thereof include propionic acid, caprylic acid, lauryl acid, stearic acid, acetic acid, adipic acid, citric acid, malic acid, maleic acid, and oxalic acid. The suitable amount of the acid to be added is from 1 to 10% by weight. If it is more than 10% by weight, the acid may cause corrosion of the circuit conductor.

Examples of the amine or amine salt include methylamine, ethylamine, butylamine, isopropylamine, cyclohexylamine, monoethanolamine, diethanolamine, triethanolamine, or a hydrochloric acid salt or bromic acid salt thereof. The suitable amount of the amine or amine salt to be added is from 0.1 to 5% by weight. If the amount exceeds 5% by weight, an ionic residue remains in an increased amount after reflow.

As the wax, carnauba wax, a synthetic wax, Japan wax, or the like can be used. Generally in an amount of from 0.5 to 5% by weight. If the amount exceeds 5% by weight, the adhesion effect is impaired.

These carboxylic acid, amine, amine salt, and wax may be used alone or may be used in combination of two or more thereof. By use of these, reflow properties can be improved, making it possible to form a precise and fine pattern. It is preferable that the resin composition be formulated so as to have such properties as a softening point of 150° C. or lower and an acid value of 50 or higher. If the softening point thereof is above 150° C. or if the acid value thereof is below 50, smooth reflow may not be attained.

A preferred example of the resin composition comprises 89–97% by weight of the rosin component, 2–8% by weight of the carboxylic acid, 0.1–1.5% by weight of the amine or amine salt, and 0.5–1.5% by weight of the wax.

With the resin composition thus prepared, the surface of solder powder is covered at a thickness of 0.05 to 10 μm. As a covering method, an ordinary technique such as spray drying can be used. Too large amount of the resin composition results in increase in the amount of ionic residues, and thus is not preferred.

Use of a fine solder powder for forming a solder circuit on a printed circuit board has a merit that a highly precise and fine pattern can be formed, but has a problem that the area of solder powder surface that is subject to oxidation is large. In the case where a solder powder containing a large amount of oxide is used, the adverse effect of the oxide film can be eliminated by using a flux, thereby to enhance the bonding strength of the solder. However, when a flux is applied on extremely fine patterns of solder powder, the solder patterns are apt to be damaged, so that not only solder bridging tends to occur between fine patterns in the solder-coated printed board obtained, but also fluctuations in solder film thickness may be experienced. In such a case, the solder particle pattern adherent to the tacky surface may be fixed by heating. This technique is preferred because it enables the application of a flux to be conducted without damaging the solder pattern. Illustratively stated, after a solder powder is adhered to the tacky surface, the adhered solder powder is heat-treated at a temperature of 20 to 250° C. for a period of 5 seconds to 60 minutes, for example, 140° C. for 10 minutes or 170° C. for 5 minutes, under such conditions as not to melt the solder. Thereafter, a flux is applied, and the solder powder is then melted and leveled to form a solder film.

In this case, even when the eutectic solder, which has a melting point of 183° C., is heated to a temperature above the melting point, the solder powder can be fixed without being melted as long as the heating time is short, probably because the surface of the solder powder is covered with an oxide film. In general, a lower heat-fixing temperature necessitates a longer heating time and a higher heat-fixing temperature necessitates a shorter heating time; it is necessary to select conditions that do not melt the solder powder. If the heat-fixing temperature is below 20° C., a sufficient effect is difficult to obtain even when the heating time is long. On the other hand, in the heat treatment at above 250° C., oxidation of the surface of the solder powder proceeds, causing a trouble in melting and bonding. It is, therefore, desired to avoid prolonged heat treatment at a high temperature. The flux to be used is not particularly limited as long as it is suited to the solder powder used. Preferred is a chlorine-free flux such as a rosin-based flux.

After application of a flux, the solder powder is melted with, e.g., a reflow furnace, whereby a highly precise and fine solder film which is free from a solder bridge and has a uniform thickness can be formed on the exposed metallic surface.

The present invention is based on a completely novel technique developed for solder film formation on only a predetermined part of a metallic surface, which technique comprises imparting tackiness to the exposed metallic part in which a solder circuit is to be formed and then adhering a solder powder thereto to thereby form a precise and fine solder film pattern.

According to the present invention, it has also become possible to form a tacky substance on only an exposed metallic surface by a chemical reaction between the metallic surface and the tacky layer-forming solution in which the surface is immersed in, or coated or printed with a tacky layer-forming solution containing a tackiness-imparting compound and to adhere a solder powder to the tacky surface to thereby form a solder film.

Although the mechanism of the above-described reaction has not been fully elucidated, it is thought that the metal and the tackiness-imparting compound of the present invention form a chelate compound showing tackiness.

Since the thus formed tacky substance deposits on only an exposed metallic surface (e.g., a pad of a solder circuit), there is no need of conducting positioning for tacky substance deposition and it has become possible to sufficiently cope with the trend toward circuit pitch reduction.

Furthermore, since a solder is adhered to this tacky substance in the present method, the formation of a bridge can be prevented by selecting an appropriate solder particle size and, hence, a fine solder film pattern can be easily formed, unlike the printing method which employs a solder powder paste as an ink.

The present invention will be explained below in more detail by reference to the following Examples, but the invention is not construed as being limited thereto.

EXAMPLE 1

A 2% by weight aqueous solution of an imidazole compound represented by formula (3), wherein the alkyl group of $R_4$ was $C_{11}H_{23}$ and $R_5$ was a hydrogen atom, was pH-adjusted to about 4 with acetic acid, giving a tacky layer-forming solution. This aqueous solution was heated to 40° C., and a copper-clad, single-sided, flexible printed circuit board which had been pretreated with an aqueous hydrochloric acid solution and had a pitch of 0.3 mm was immersed in the tacky layer-forming solution for 3 minutes to form a tacky substance.

The resulting printed circuit board was then washed with water and dried. It was ascertained thereafter that the tacky substance had deposited precisely on the pads only. An eutectic solder powder having an average particle diameter of about 40 μm was sprinkled over the dry printed circuit board, which was then lightly brushed to thereby adhere the solder powder selectively to the tacky substance parts. Thereafter, the solder powder was melted in a 240° C. oven. As a result, a thin eutectic solder layer having a thickness of about 20 μm was formed with high precision on the exposed copper circuit parts.

EXAMPLE 2

The same procedures as in Example 1 were conducted except that copper ions were added at a concentration of 200 ppm, the concentration of the tackiness-imparting compound used in Example 1 was changed to 0.5% by weight, and the immersion time was changed to 90 seconds. Despite the lower imidazole compound concentration and the shorter immersion time than those in Example 1, the formation of a tacky layer was on a level satisfactory for solder particle adhesion, and a thin eutectic solder layer having a thickness of about 20 μm and almost the same as that in Example 1 was formed with high precision.

EXAMPLE 3

The same procedures as in Example 1 were conducted except that a 0.2% by weight aqueous solution of a benzoimidazole compound represented by formula (4), wherein $R_6$ was $C_8H_{17}$ and $R_7$ was a hydrogen atom, was used, and that a copper-clad, single-sided, flexible printed circuit board which had been pretreated with an aqueous hydrochloric acid solution and had a pitch of 0.25 mm was used. The solder circuit thus obtained had sufficiently coped with the 0.25-mm pitch.

EXAMPLE 4

The same procedures as in Example 3 were conducted except that a benzoimidazole compound represented by formula (4), wherein $R_6$ was a butylthio group and $R_7$ was a hydrogen atom, was used. As a result, a highly precise and fine solder circuit having a pitch of 0.25 mm was obtained as in Example 3.

EXAMPLE 5

A tacky layer-forming solution was prepared by pH-adjusting a 0.5% by weight aqueous solution of 5-laurylbenzotriazole (a compound of formula (1)) to about 3 in the presence of sulfuric acid and methyl alcohol. This solution was heated to 50° C., and the subsequent procedures were conducted in the same manner as in Example 1. As a result, a satisfactory circuit was obtained as in Example 1.

EXAMPLE 6

A tacky layer-forming solution was prepared by pH-adjusting a 0.2% by weight aqueous solution of 5-butyl-2-mercaptobenzothiazole (a compound of formula (5)) to about 4 in the presence of methyl alcohol and triethanolamine. Using this aqueous solution, the same procedures as in Example 5 were conducted. As a result, a satisfactory circuit was obtained as in Example 1.

EXAMPLE 7

A tacky layer-forming solution was prepared by pH-adjusting a 0.5% by weight aqueous solution of 4-methylnaphthotriazole (a compound of formula (2)) to about 3 in the presence of sulfuric acid, triethanolamine, and methanol. Using this aqueous solution, the same procedures as in Example 5 were conducted to obtain good results as in Example 1.

EXAMPLE 8

A tacky layer-forming solution was prepared by pH-adjusting a 0.5% by weight aqueous solution of 2-[2-(benzothiazolyl)thio]propionic acid (a compound of formula (6)) to about 4 in the presence of methanol. Using this aqueous solution, the same procedures as in Example 5 were conducted to obtain good results as in Example 1.

EXAMPLE 9

A 0.5% aqueous solution of 6-diisooctylamino-1,3,5-triazine-2,4-dithiol monosodium salt represented by formula (7), wherein $R_{11}$ was a diisooctylamino group

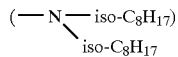

and M was Na, was heated to 80° C. to obtain a treating solution for tacky layer formation. A printed board having a 0.3 mm-pitch exposed copper circuit parts for connection with a QFP (quad flat package) was immersed in the treating solution for 10 minutes, pulled up, washed with water, and then dried. As a result, only the exposed copper circuit part surfaces had developed tackiness. A solder powder having a diameter of 40 μm was adhered to the tacky parts and then melted with a reflow furnace regulated to have a temperature of 240° C. to thereby obtain a solder coat having an almost uniform thickness of about 20 μm.

EXAMPLE 10

A 0.5% aqueous solution of 6-oleylamino-1,3,5-triazine-2,4-dithiol monosodium salt represented by formula (7), wherein $R_{11}$, was an oleylamino group ($-NHC_8H_{16}CH=CHC_8H_{17}$) and M was Na, was heated to 80° C., giving a treating solution. The subsequent procedures were conducted in the same manner as in Example 9. As a result, a satisfactory solder coat was obtained.

EXAMPLE 11

A continuous sheet comprising a polyimide film substrate and a copper foil laminated thereto was subjected to etching by an ordinary method to obtain a copper pattern. Thereafter, a polyimide film having punched-out openings corresponding to the parts to be solder-coated was positioned on and laminated to the copper pattern with an adhesive. The continuous sheet thus obtained was subjected to a pretreatment in which the exposed copper parts were lightly etched by an ordinary method. The pretreated sheet was then treated by passing it, over a period of 30 seconds, through a 50° C. bath of a 1% by weight aqueous acetic acid solution of 2-undecylimidazole that forms a chelate compound with copper metal which solution had been pH-adjusted to about 4 with acetic acid. The resulting sheet was washed with water and dried to form a tacky layer of about 0.2 μm thick selectively on the exposed copper surfaces. Thereafter, a solder powder having an average particle diameter of 40 μm was adhered to the tacky layer and heated to 170° C. for 5 minutes to fix. Then a flux was applied to the fixed solder powder, followed by heating in a reflow furnace to melt the solder and form a solder film. Thus, printed circuit boards having a solder coat of about 20 μm thick were obtained as a continuous sheet.

In the case of patterns of the above-described type, 1,150 independent printed circuit boards were able to be obtained by the method of the invention on the continuous sheet substrate having an area corresponding to that necessary for obtaining 1,000 printed circuit boards by the conventional electroplating method in which dummy parts should be formed for electrical connection according to pattern arrangement. This shows that 15% extra printed circuit boards can be produced, so that a production cost of the printed circuit can be reduced.

EXAMPLE 12

A 2% by weight aqueous solution of an imidazole compound represented by formula (3), wherein the alkyl group of $R_4$ was $C_{11}H_{23}$ and $R_5$ was a hydrogen atom, was pH-adjusted to about 4 with acetic acid, giving a tacky layer-forming solution. This aqueous solution was heated to 40° C., and a QFP which had been pretreated with an aqueous hydrochloric acid solution and had a pitch of 0.3 mm was immersed therein for 3 minutes to form a tacky substance.

The resulting QFP was then washed with water and dried. It was ascertained thereafter that the tacky substance had deposited precisely on the lead frames only. An eutectic solder powder having an average particle diameter of 40 μm was sprinkled over the dry QFP, which was then lightly brushed to thereby adhere the solder powder selectively to the tacky substance parts. The adhered solder powder was then fixed in situ by heating at 170° C. for 5 minutes, followed by applying a flux to the fixed solder. Thereafter, the solder powder was melted in a 240° C. oven. As a result, a thin eutectic solder layer having a thickness of about 20 μm was formed with high precision on the lead frames.

EXAMPLE 13

The same procedures as in Example 12 were conducted except that copper ions were added at a concentration of 200 ppm, the concentration of the tackiness-imparting compound used in Example 12 was changed to 0.5% by weight, and the immersion time was changed to 30 seconds. Despite the lower imidazole compound concentration and the shorter immersion time than those in Example 12, the formation of a tacky film was on a level satisfactory for solder particle adhesion, and a thin eutectic solder layer having a thickness of about 20 μm and almost the same as that in Example 12 was formed with high precision.

EXAMPLE 14

The same procedures as in Example 12 were conducted except that a 0.2% by weight aqueous solution of the benzoimidazole compound represented by formula (4), wherein $R_6$ was $C_8H_{17}$ and $R_7$ was a hydrogen atom, was used, and that a TAB (tape automated bonding) which had been pretreated with an aqueous hydrochloric acid solution and had a pitch of 0.25 mm was used. The solder coat thus obtained had sufficiently coped with the 0.25-mm pitch.

EXAMPLE 15

The same procedures as in Example 14 were conducted except for using a benzoimidazole compound represented by formula (4), wherein $R_6$ was a butylthio group and $R_7$ was a hydrogen atom. As a result, a highly precise and fine solder coat having a pitch of 0.25 mm was obtained as in Example 14.

EXAMPLE 16

A tacky layer-forming solution was prepared by pH-adjusting a 0.5% by weight aqueous solution of 5-laurylbenzotriazole (a compound of formula (1)) to about 3 in the presence of sulfuric acid and methyl alcohol. This solution was heated to 50° C., and the subsequent procedures were conducted in the same manner as in Example 12. As a result, a satisfactory solder coat was obtained as in Example 12.

EXAMPLE 17

A tacky layer-forming solution was prepared by pH-adjusting a 0.2% by weight aqueous solution of 5-butyl-2-mercaptobenzothiazole (a compound of formula (5)) to about 4 in the presence of methyl alcohol and triethanolamine. Using this aqueous solution, the same procedures as in Example 16 were conducted. As a result, a satisfactory solder coat was obtained as in Example 12.

EXAMPLE 18

A tacky layer-forming solution was prepared by pH-adjusting a 0.5% by weight aqueous solution of 4-methylnaphthotriazole (a compound of formula (2)) to about 3 in the presence of sulfuric acid, triethanolamine, and methanol. Using this aqueous solution, the same procedures as in Example 16 were conducted to obtain good results as in Example 12.

EXAMPLE 19

A tacky layer-forming solution was prepared by pH-adjusting a 0.5% by weight aqueous solution of 2-[2-(benzothiazolyl)thio]propionic acid (a compound of formula (6)) to about 4 in the presence of methanol. Using this solution, the same procedures as in Example 16 were conducted to obtain good results as in Example 12.

EXAMPLE 20

A 2% by weight aqueous solution of an imidazole compound represented by formula (3), wherein the alkyl group of $R_4$ was $C_{11}H_{23}$ and $R_5$ was a hydrogen atom, was pH-adjusted to about 4 with acetic acid, giving a solder tacky layer-forming solution. This aqueous solution was heated to 40° C., and a copper-clad, double-sided printed board which had been pretreated with an aqueous hydrochloric acid solution and had through-hole parts and a pitch of 0.3 mm was immersed in the tacky layer-forming solution for 3 minutes to form a tacky substance. The resulting printed board was then washed with water and dried. A powdered eutectic solder having a particle diameter of about 40 μm was adhered to the printed board by the method shown in FIG. 1. As a result, the solder powder was densely adhered simultaneously on both sides. Further, the solder powder was densely adhered also to the inner wall of each through-hole having a diameter of 0.3 mm, as illustrated in FIG. 3.

EXAMPLE 21

Tackiness was imparted to a copper foil-clad, double-sided printed board in the same manner as in Example 20. A powdered eutectic solder of 40 μm was then adhered by the method shown in FIG. 2 under conditions of a frequency of 100 cpm, an amplitude of 4 mm, and a vibrational angle of 30 degrees, while the printed board was being moved in the same direction as the powder. As a result, the solder powder was densely adhered to both sides of the printed board. Further, the solder powder was densely adhered also to the inner walls of 0.3-mm through-holes.

EXAMPLE 22

A resin composition was prepared by mixing 93% by weight of rosin having a softening point of 100° C. and an acid value of 120 with 5% by weight of caprylic acid, 1% by weight of cyclohexylamine bromate, and 1% by weight of carnauba wax. The surface of eutectic solder powder having an average particle diameter of 50 μm was covered with this resin composition by a spray drying method at a thickness of about 5 μm.

Subsequently, a tacky layer-forming solution obtained by pH-adjusting a 2% by weight aqueous solution of 2-undecylimidazole to about 4 with acetic acid was heated to 40° C. A copper foil-clad, single-sided, flexible printed board which had been pretreated with an aqueous hydrochloric acid solution and had a pitch of 0.3 mm was immersed in the tacky layer-forming solution for 3 minutes to form a tacky substance.

The resulting printed circuit board was then washed with water and dried. Thus, the tacky substance was deposited precisely on pads only. The coated eutectic solder powder obtained above was then sprinkled over the dry printed circuit board, and the excess solder powder was removed by lightly brushing the circuit board to thereby attain selective adhesion to the tacky parts. Thus, a satisfactory solder powder pattern was obtained.

The circuit board having this solder powder pattern thereon was heated in a 250° C. conveyor oven to melt and level the solder powder, thereby giving a satisfactory solder circuit pattern.

This solder circuit pattern thus obtained had a uniform solder film thickness of 30 μm. The concentration of residual ions was 8 μg NaCl/inch² as determined without washing.

EXAMPLE 23

A printed circuit board which was for connection with a 0.25 mm-pitch TAB and in which copper in the corresponding 0.25 mm-pitch copper pads had been exposed, was immersed at 40° C. for 30 seconds in a 1% by weight aqueous solution of 2-dodecylimidazole whose pH had been adjusted to about 4 with acetic acid. The resulting printed board was washed with water and dried to selectively form a tacky substance layer on the surfaces of the copper pads. An eutectic solder powder having an average particle diameter of about 50 μm was sprinkled over the printed circuit board, which was then lightly brushed thereby to obtain a highly precise and fine solder pattern in which the solder powder was selectively adherent to the tacky substance parts.

The resulting printed circuit board was heated at 170° C. for 5 minutes to fix the solder powder. Subsequently, a commercially available, rosin-based flux was applied and the printed board was then placed in a 230° C. reflow furnace for 1 minute to thereby melt the solder powder and form a solder circuit. Thus, a printed circuit board having the copper pad surfaces covered with a highly precise and fine solder coat having a uniform thickness of 30 μm was obtained. Printed boards thus obtained were randomly sampled to examine 50 samples for solder bridging. As a result, all the samples had no problem.

EXAMPLE 24

Figure 4:
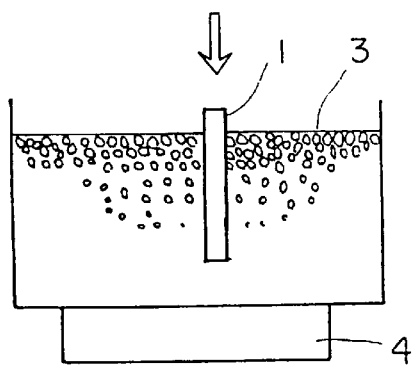
FIG. 4 is a diagrammatic view illustrating a solder-adhering technique in which a printed circuit board is thrusted into a solder powder layer which is being shaken by a vibrator.

The same procedure as in Example 20 were conducted, except that the circuit board was thrusted vertically into a solder powder layer which was being shaked by a vibrator under conditions of a frequency of 3,000 cpm, an amplitude of 1 mm, as shown in FIG. 4 wherein numerals 1, 3 and 4 denote a printed circuit board, a solder powder layer and a vibrator, respectively. As a result, the solder powder was densely adhered on both sides and inner walls of the printed board.

The solder film-forming method according to the present invention is based on a principle utterly different from those in the conventional methods for solder film formation. That is, the method of this invention comprises simple procedures consisting only of immersing or coating the exposed metallic circuit part(s) of a printed circuit board in or with a tacky layer-forming solution containing a tackiness-imparting compound to thereby impart tackiness to the exposed metallic circuit part(s), subsequently adhering a solder powder to the solder circuit part(s), (optionally fixing the solid powder by heating, to which a flux is further applied), and then melting and leveling the solder powder. Thus, it has become possible to accurately form a precise and fine pattern without the necessity of troublesome operations such as positioning.

Furthermore, since the solder film thus formed has no bridges, products can be obtained at a high production efficiency and a low off-specification rate.

While the invention has been described in detail and with reference to specific embodiments thereof, it will be apparent to one skilled in the art that various changes and modifications can be made therein without departing from the spirit and scope thereof.

What is claimed is:

1. A solder powder which consists of solder particles whose surfaces have been covered at a thickness of 0.005 to 10 $\mu$m with a resin composition containing a rosin or a rosin derivative as an essential component and further containing at least one member selected from a carboxylic acid in an amount of 1 to 10% by weight, an amine or an amine salt in an amount of 0.1 to 5% by weight, and a wax in an amount of 0.5 to 5% by weight.

2. A solder powder as in claim 1, wherein the rosin or rosin derivative is present in an amount of 89 to 97% by weight based on the total weight of the resin composition.

* * * * *